United States Patent
Chang (10) Patent No.: US 7,059,388 B2
(45) Date of Patent: Jun. 13, 2006

(54) HEAT DISSIPATING DEVICE

(76) Inventor: Kuo Ta Chang, 235 P.O. Box 10-69, Chung-Ho, Taipei (TW)

( * ) Notice: Subject to any disclaimer, the term of this patent is extended or adjusted under 35 U.S.C. 154(b) by 171 days.

(21) Appl. No.: 10/740,014

(22) Filed: Dec. 19, 2003

(65) Prior Publication Data

US 2005/0133197 A1  Jun. 23, 2005

(51) Int. Cl.
*H05K 7/20* (2006.01)
(52) U.S. Cl. .................. 165/80.3; 361/697; 165/121
(58) Field of Classification Search .............. None
See application file for complete search history.

(56) References Cited

U.S. PATENT DOCUMENTS

| | | | | |
|---|---|---|---|---|
| 4,823,869 A | * | 4/1989 | Arnold et al. | 165/185 |
| 4,899,210 A | * | 2/1990 | Lorenzetti et al. | 257/712 |
| 5,132,780 A | * | 7/1992 | Higgins, III | 257/722 |
| 5,455,382 A | * | 10/1995 | Kojima et al. | 174/16.3 |
| 6,390,181 B1 | * | 5/2002 | Hall et al. | 165/80.3 |
| 6,459,580 B1 | * | 10/2002 | Della Fiora et al. | 361/697 |
| 6,538,888 B1 | * | 3/2003 | Wei et al. | 361/697 |
| 6,550,531 B1 | * | 4/2003 | Searls et al. | 165/104.33 |
| 6,691,768 B1 | * | 2/2004 | Hsieh et al. | 165/80.3 |
| 6,942,025 B1 | * | 9/2005 | Nair et al. | 165/185 |
| 2003/0007867 A1 | * | 1/2003 | Chang | 415/220 |
| 2003/0137807 A1 | * | 7/2003 | Chen | 361/697 |
| 2004/0085729 A1 | * | 5/2004 | Lin | 361/695 |

* cited by examiner

*Primary Examiner*—Allen J. Flanigan (57) ABSTRACT

A heat dissipating device comprises a turbine-type fan having a plurality of blades; a cover covering the blades; a wind collecting mask installed below the cover; and a wind outlet formed in the wind collecting mask. A heat dissipating seat is installed below the turbine-type fan; and a plurality of heat dissipating units extends from a surface of the heat dissipating seat. Wind is sucked by the turbine-type fan, then flows toward the wind collecting mask, then flows out of the outlet of the wind collecting mask to enter into the heat dissipating units and then flows to the heat dissipating seat for dissipating heat from the heat dissipating units and the heat dissipating seat.

2 Claims, 12 Drawing Sheets

HEAT DISSIPATING DEVICE

FIELD OF THE INVENTION

The present invention relates to heat dissipating devices, and particular to a heat dissipating device having a structure which can guide wind effectively so that no dead point is generated.

BACKGROUND OF THE INVENTION

Due to the compactness, high speed, and moduleless, and small sizes of modern electronic devices, heat dissipation of the electronic devices must be promoted with the improvement of the technologies.

Figure 1:
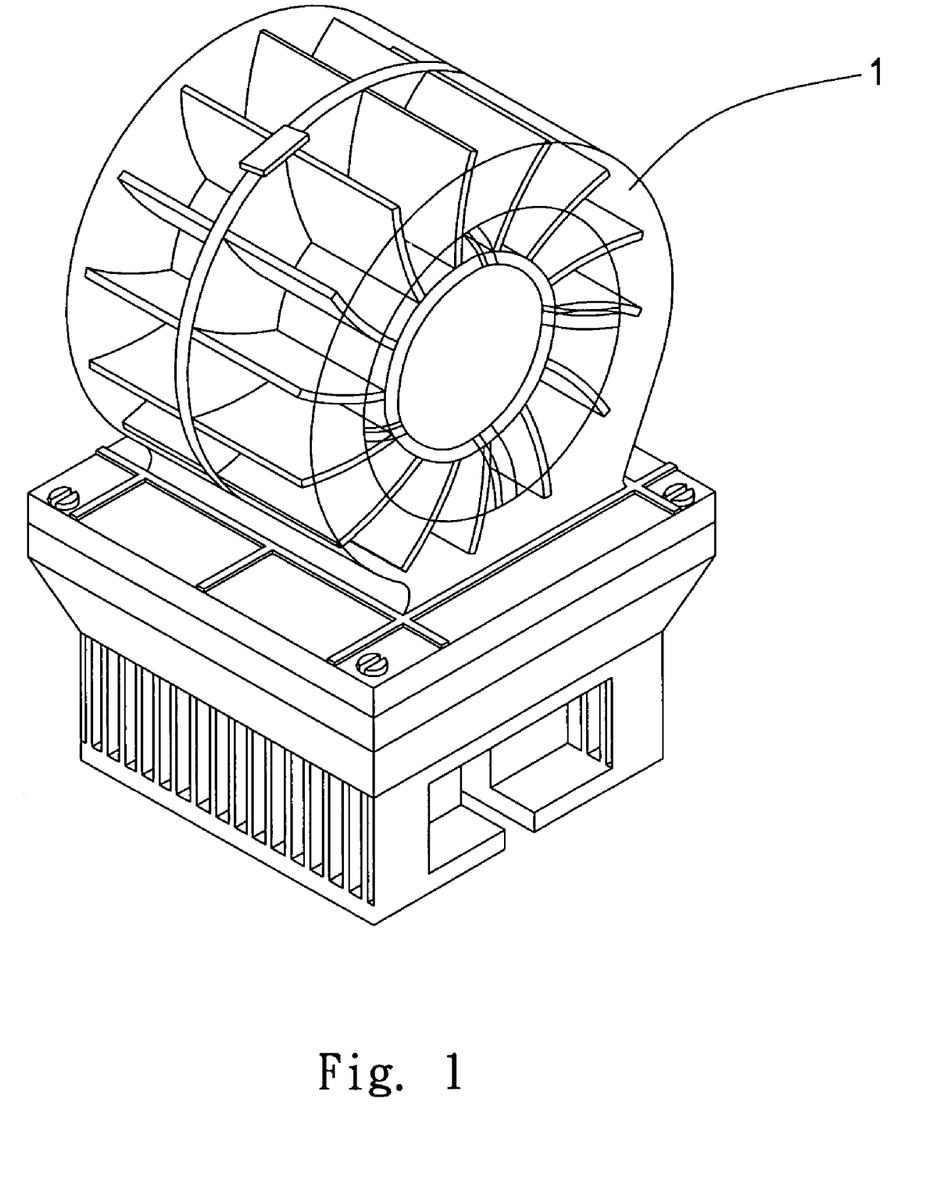
FIG. 1 is a perspective view of a prior art heat dissipating device.
Figure 2:
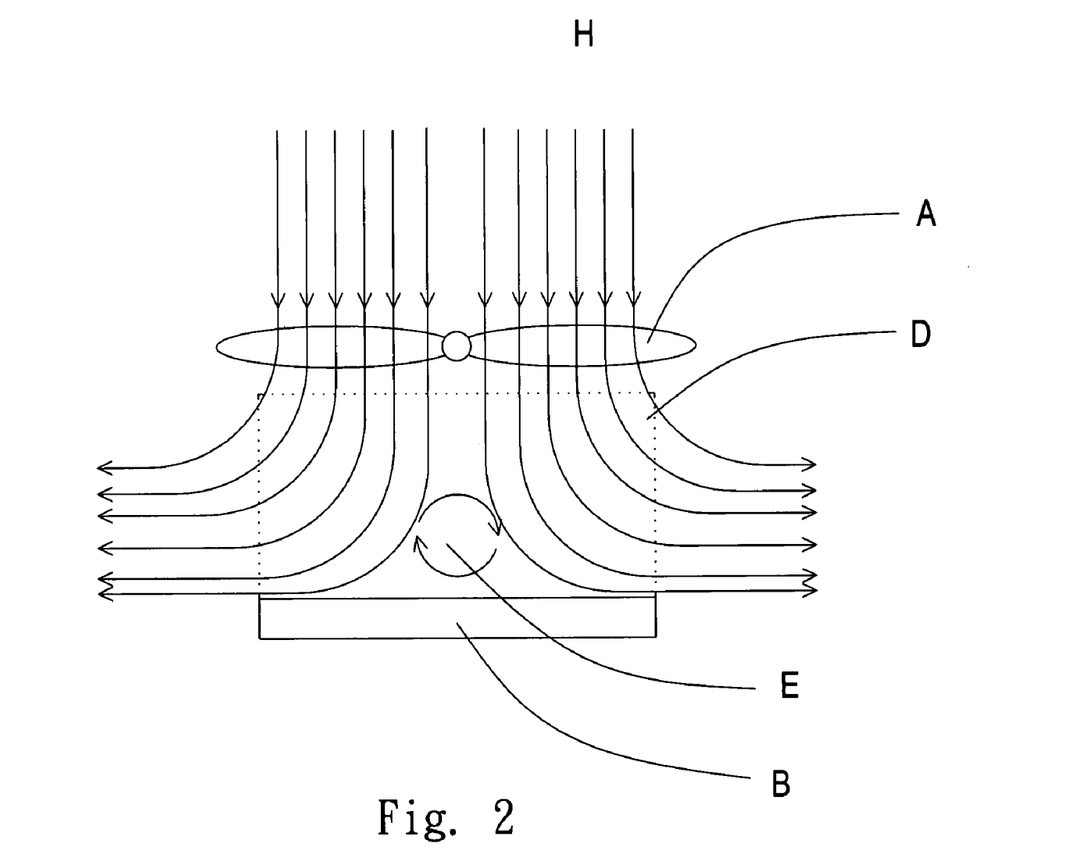
FIG. 2 shows the wind flow of the prior art heat dissipating device.
Figure 3:
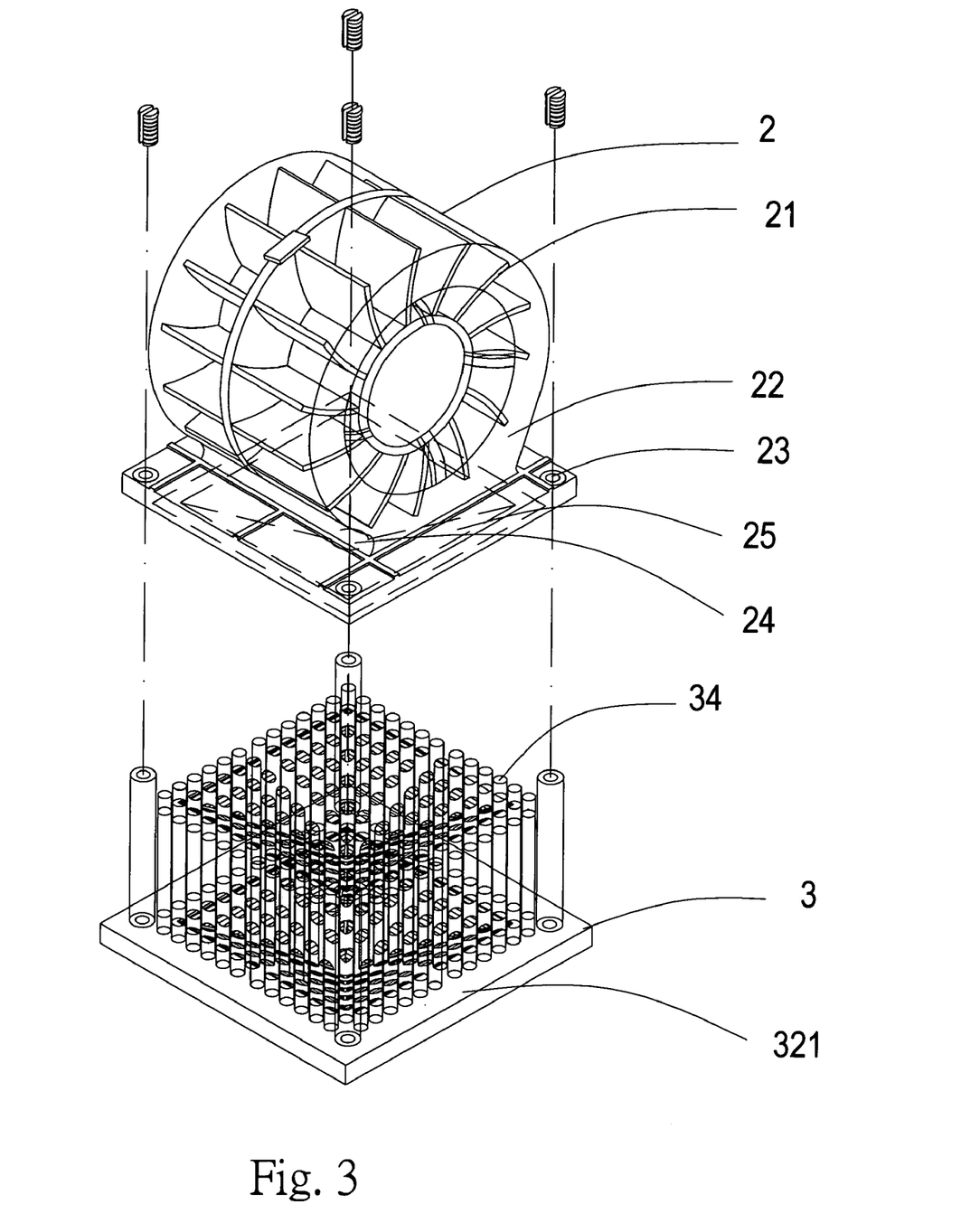
FIG. 3 is an exploded perspective view of the present invention.
Figure 4:
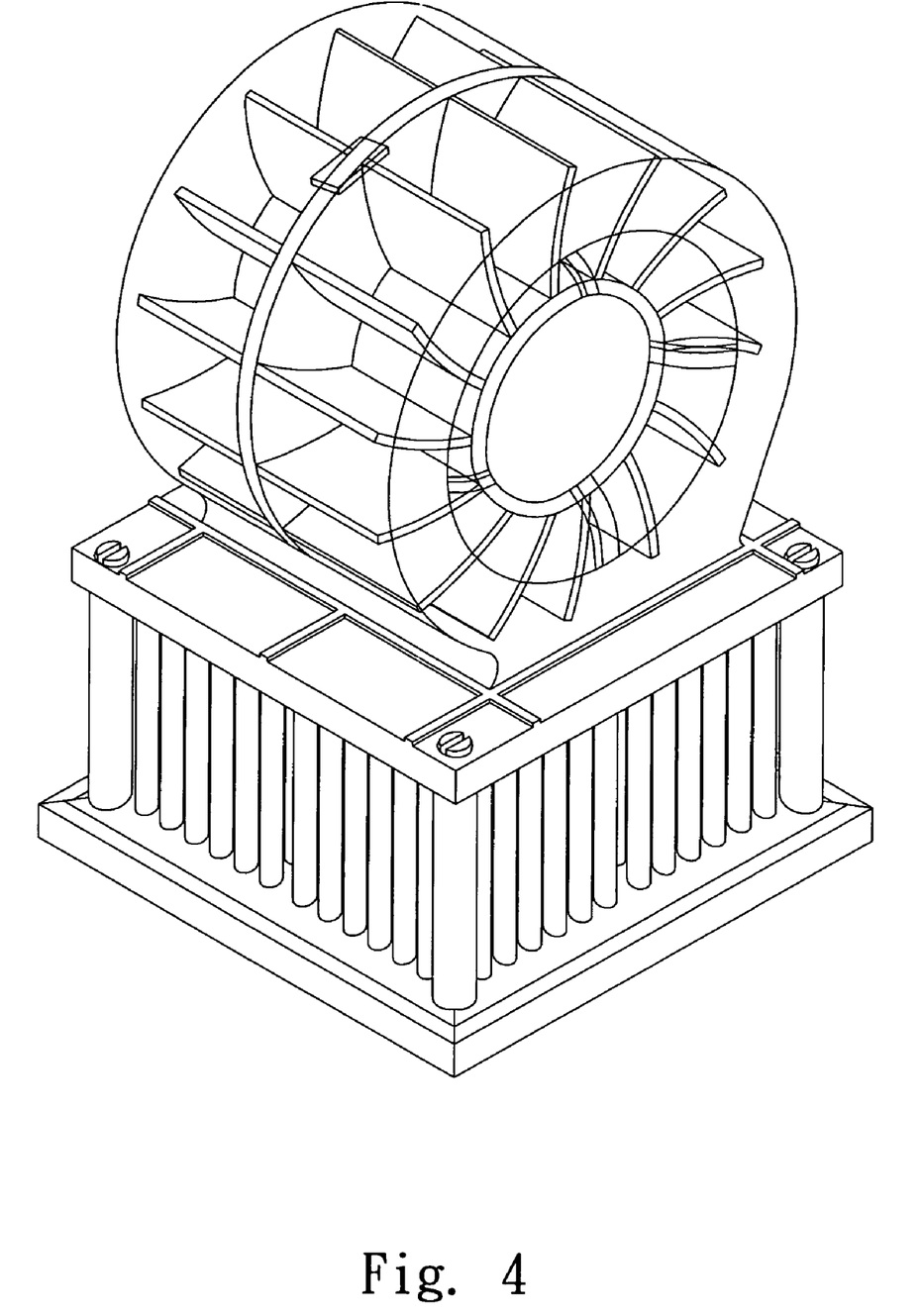
FIG. 4 is a perspective view of the present invention.
Figure 5:
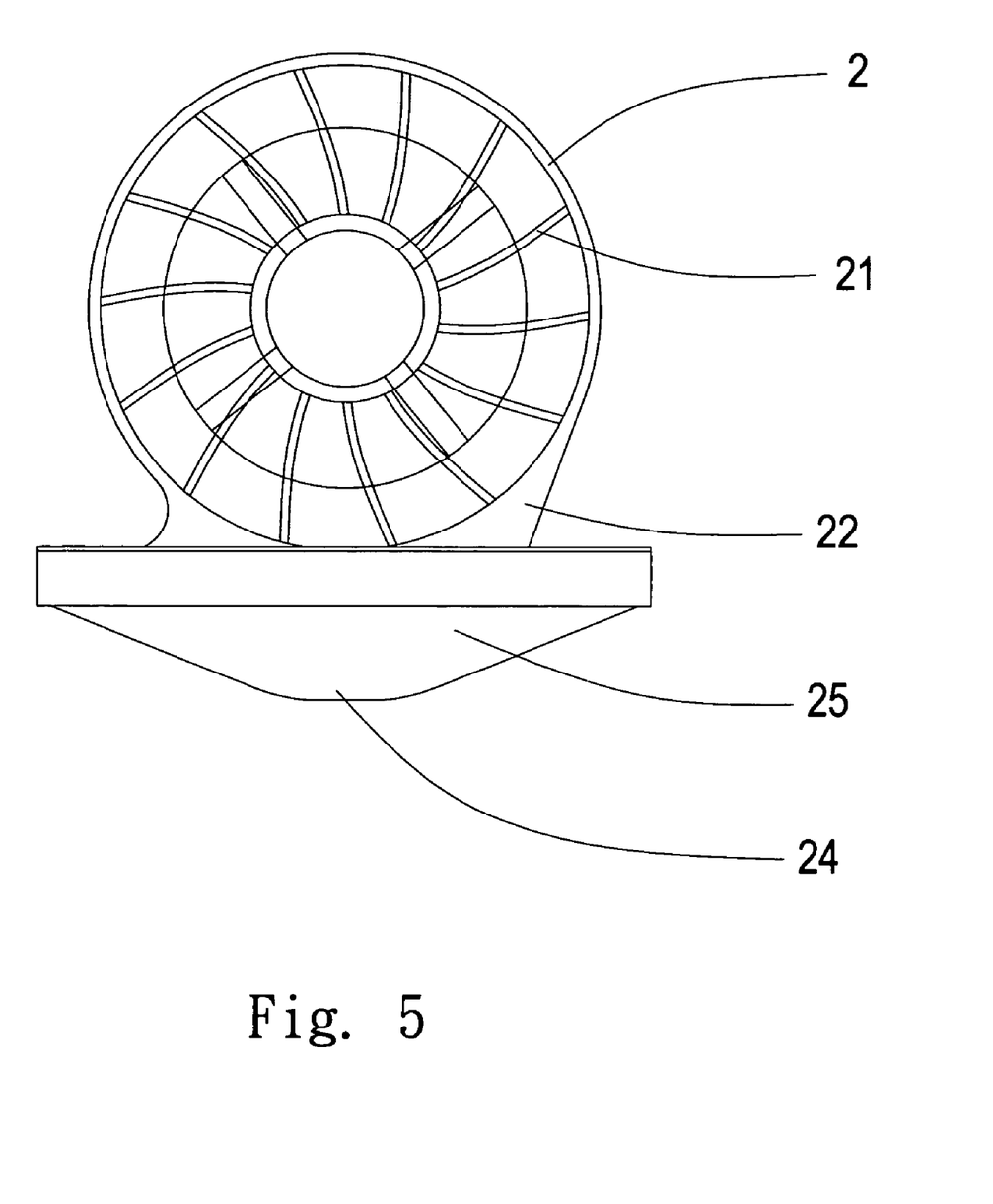
FIG. 5 is a structural perspective view of the fan of the present invention.

Currently, wind blowing from heat dissipating fans has a wide coverage and is weak. Moreover, dead ends are formed. With reference to FIG. 2, a direct blowing fan D blows wind by using blades A. Thereby, the wind in the center of the fan is weak or no wind blows out in the center of the fan so as to form a dead point E.

For the seat B of the heat dissipating device, it is often that the center of the heat dissipating seat has highest thermal energy so that the heat dissipation is not preferred. Theoretically, the larger the heat dissipating area, the higher the heat dissipating efficiency. Thereby, more and more heat dissipating fins or pin fins cause stronger heat dissipating effect. However, in prior art heat dissipating seat, since tops C of the fins or pin fins have interface impedance which increase with the increment of the density of the fins or pin fins. Thereby, the density of the fins or pin fins are confined, otherwise the wind will reflect from the tops of the fins or pin fins so that the wind can not flow into the heat dissipating device, as a result the heat dissipating efficiency is decreased greatly.

Figure 21:
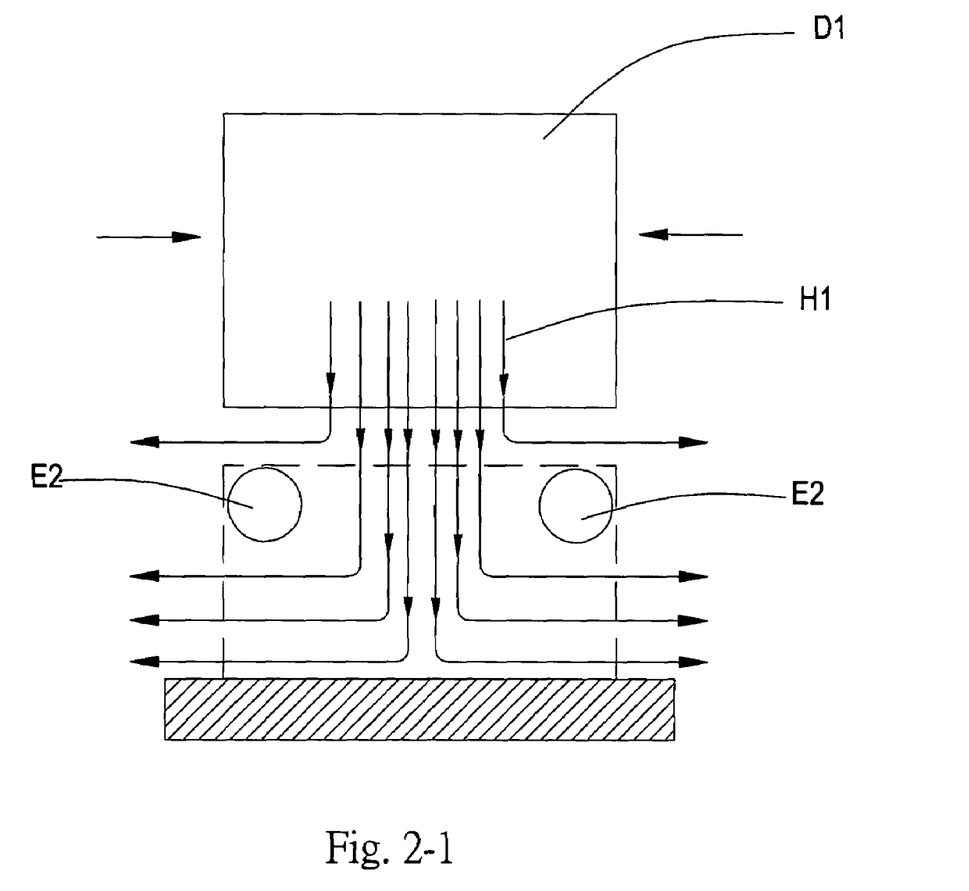
Figure 31:
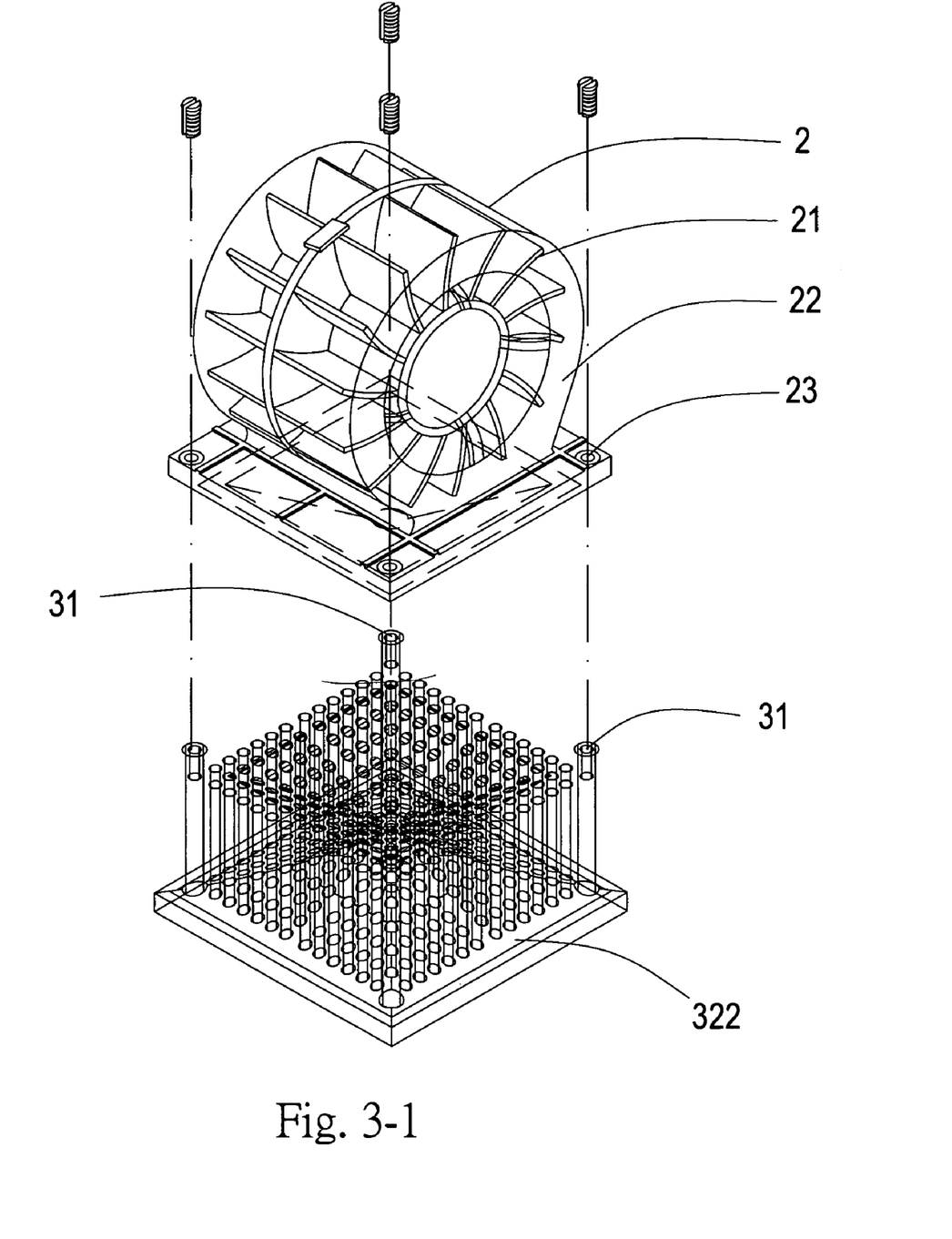
Figure 51:
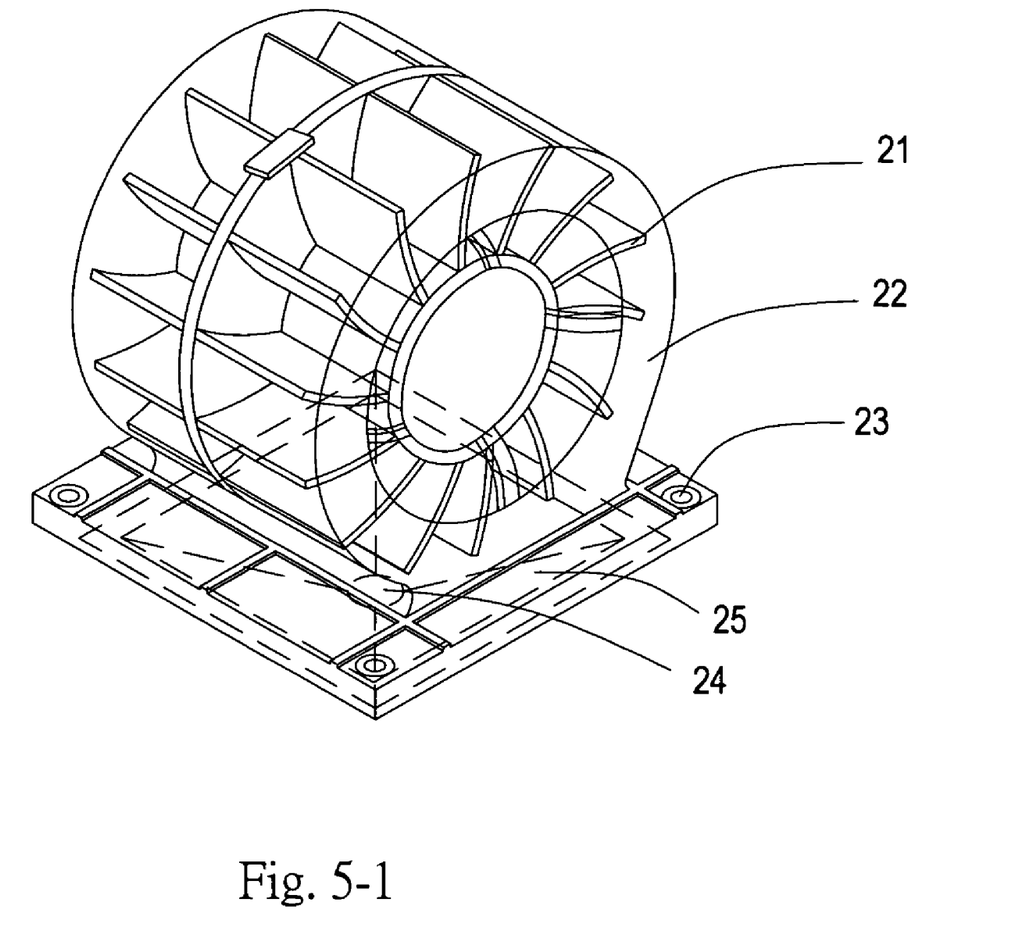

In another prior art, turbine form heat dissipating fan, as fan D1 illustrated in FIG. 2-1, is used. Since the intensity of wind is strong and the wind direction H1 cannot be controlled. Thereby, the wind flow H1 is unsteady. Turbulent flow or high density flow is easily generated so as to form another kind of heat dissipating dead point E2. Thereby, the improvement of heat dissipating efficiency is limited.

Another improvement is water-cooled heat dissipating devices, however, such kind devices easily generate wet moistures. This is unbeneficial to electronic products.

SUMMARY OF THE INVENTION

Accordingly, the primary object of the present invention is to provide a heat dissipating device having a structure which can guide wind effectively so that no dead point is generated.

To achieve above said object, the present invention provides a heat dissipating device comprises a turbine-type fan having a plurality of blades; a cover covering the blades; a wind collecting mask installed below the cover; and a wind outlet formed in the wind collecting mask. A heat dissipating seat is installed below the turbine-type fan; and a plurality of heat dissipating units extends from a surface of the heat dissipating seat. Wind is sucked by the turbine-type fan, then flows toward the wind collecting mask, then flows out of the outlet of the wind collecting mask to enter into the heat dissipating units and then flows to the heat dissipating seat for dissipating heat from the heat dissipating units and the heat dissipating seat.

The various objects and advantages of the present invention will be more readily understood from the following detailed description when read in conjunction with the appended drawing.

BRIEF DESCRIPTION OF THE DRAWINGS

FIG. 2-1 is a schematic view showing the airflow in the prior art turbine type heat dissipating device.

FIG. 3-1 shows another embodiment of the present invention.

FIG. 5-1 is a lateral view showing the structure of the fan of the present invention.

FIG. 6-1 shows one embodiment of the present invention, wherein an upper surface of the heat dissipating seat is convex.

FIG. 7-1 shows the wind direction of the embodiment illustrated in FIG. 6-1.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

With reference to FIGS. 3, 4, 5 and 5-1, the present invention comprises a turbine-type fan 2, the turbine-type fan 2 has a plurality of blades 21; a cover 22 covering the blades 21; a wind collecting mask 25 installed below the cover 22; and a wind outlet 24 at a center of the wind collecting mask 25. A heat dissipating seat 3 is installed below the turbine-type fan 2. A plurality of heat dissipating pin fins 34 extend from a surface of the heat dissipating seat 3 (in the present invention, the heat dissipating pin fins 34 are only one example, other devices which can achieve the same effect are also within the scope of the present invention, such as heat dissipating fins). The upper surface of the heat dissipating seat 3 is curved surface, for example, a concave surface 321 shown in FIG. 3, or a convex surface 322 shown in FIG. 4. The turbine-type fan 2 is locked to the heat dissipating seat 3 by screwing through the screw holes 23 thereof to the screw rods 31 of the heat dissipating seat 3.

Figure 6:
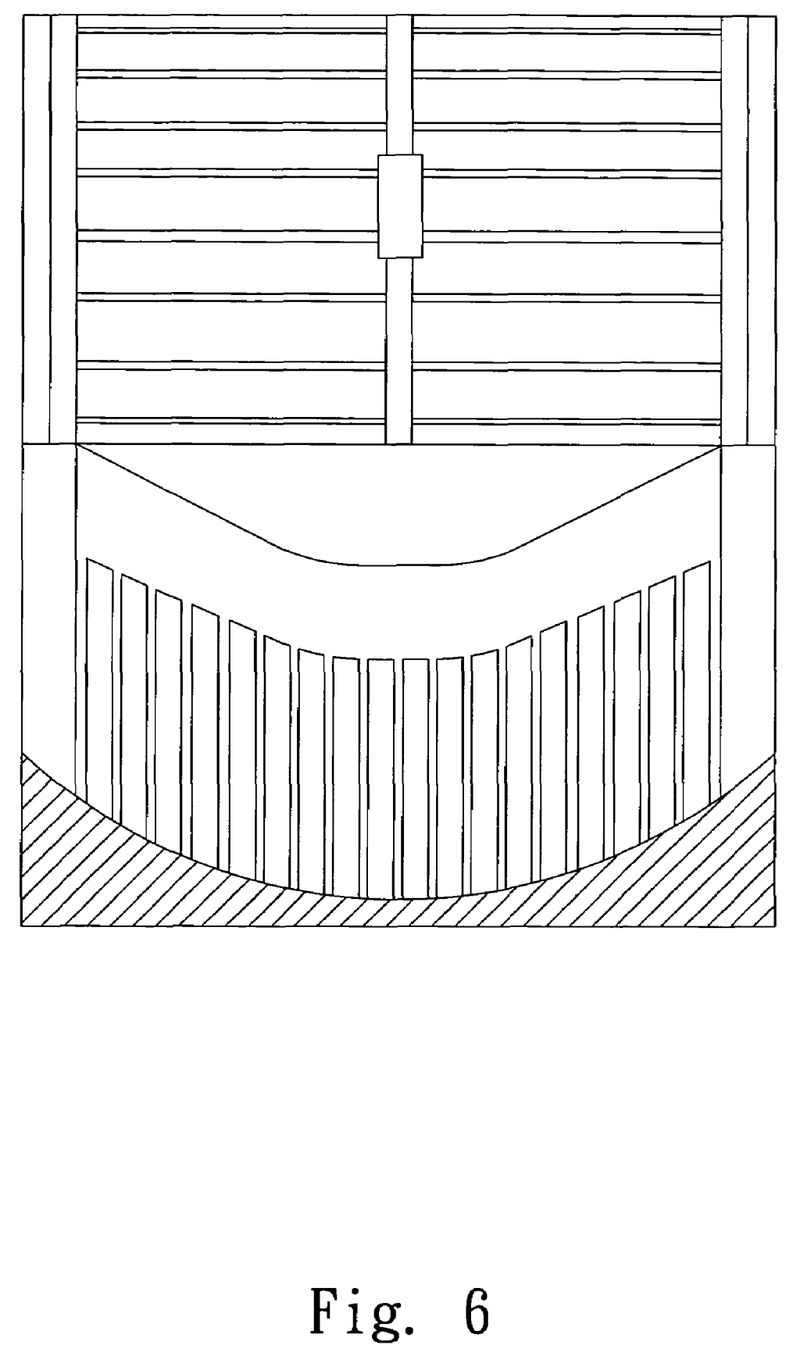
FIG. 6 shows one embodiment of the present invention, wherein an upper surface of the heat dissipating seat is concave.
Figure 7:
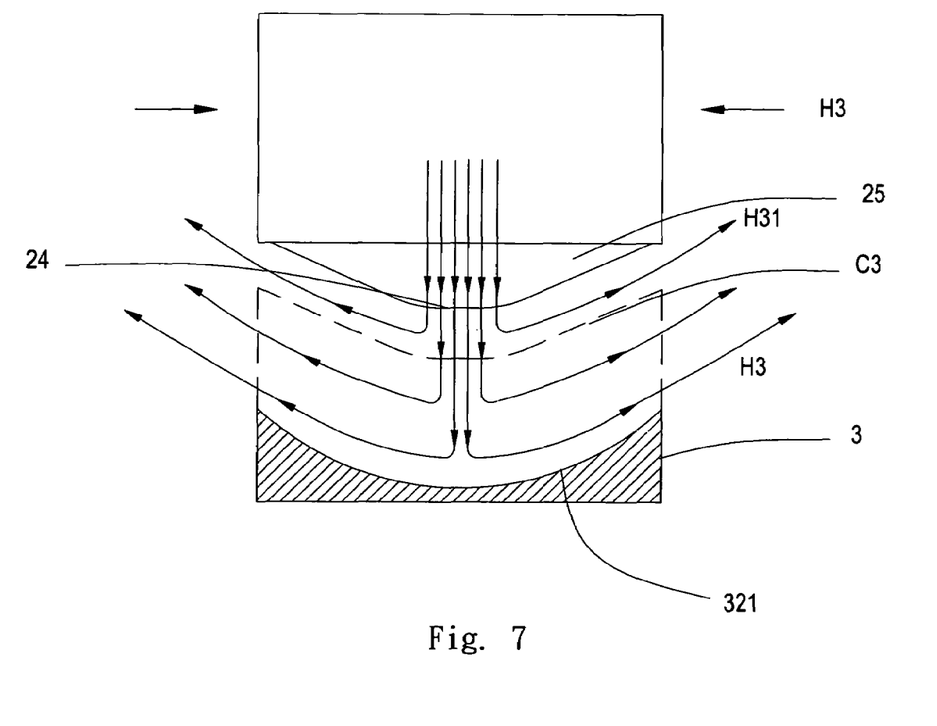
FIG. 7 shows the wind direction of the embodiment illustrated in FIG. 6.
Figure 61:
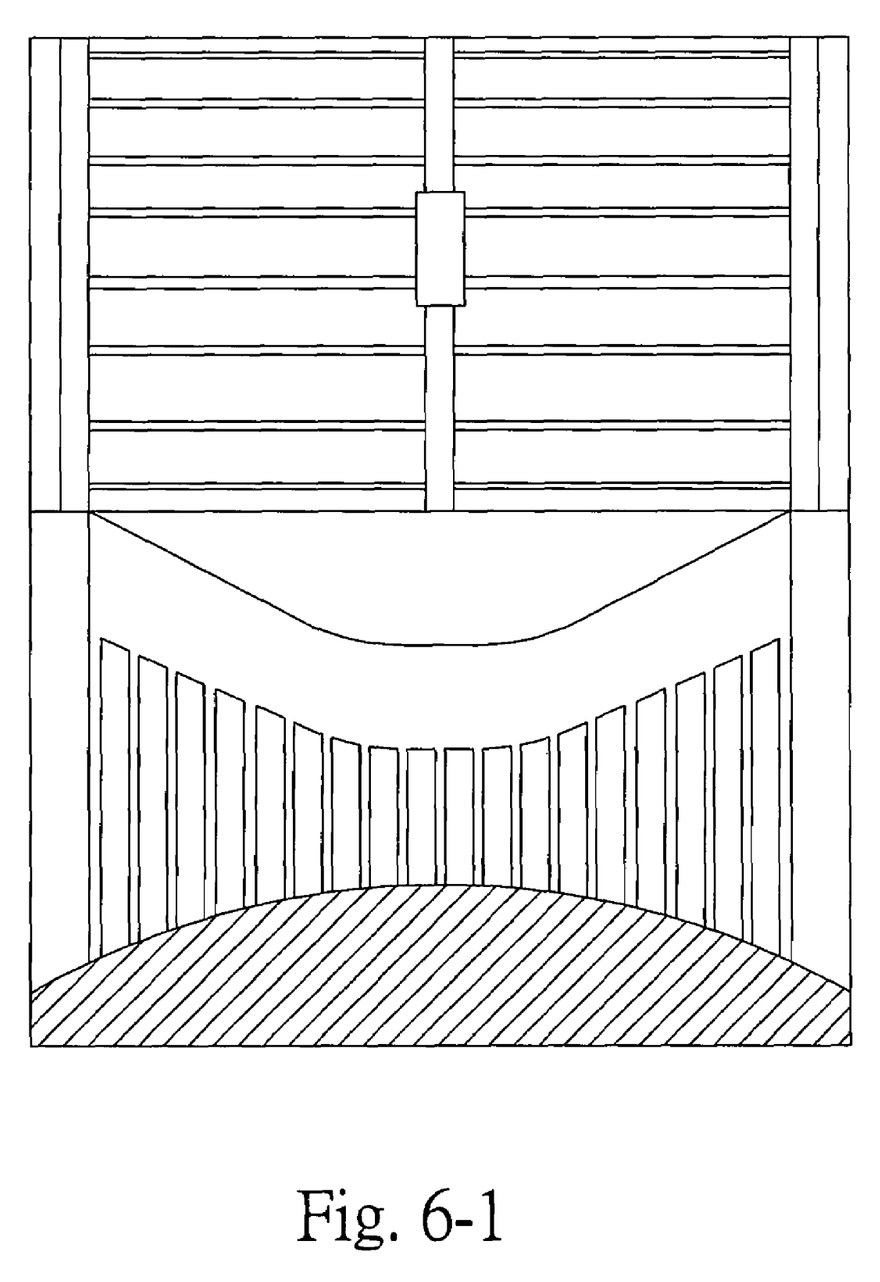
Figure 71:
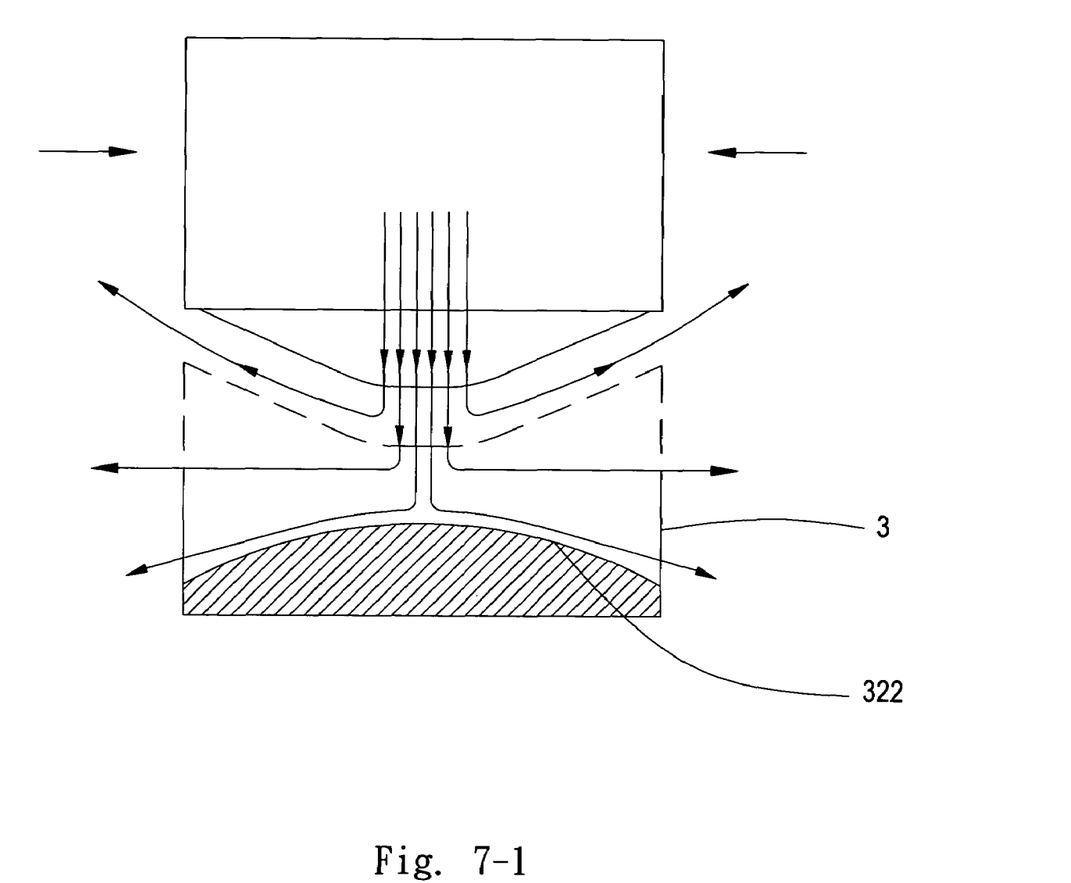

In operation of the present invention, referring to FIGS. 6 and 6-1, where the tops of the pin fins are formed as a concave surface and the upper surface 321 of the heat dissipating seat 3 is concave. In this embodiment, wind H3 is sucked into the present invention by the fan. The air will be collected by the wind collecting mask 25 so as to enhance the strength of the wind. The wind blows downward from the wind outlet 24. The wind resistance will be reduced by concave surface formed by the tops of the pin fins C3. The wind will distribute along the cambered surface of the top of the pin fins and the surface of the mask so as to dissipate heat to be blown out with an uniform distribution.

Furthermore, most of wind will blow downwards to blow the center area of the seat 3. Since the surface 321 of the seat is a concave surface, the wind direction H3 is guided to have uniform distribution for dissipating heat effectively. Thereby, by the double effects of the concave surface 321 and the wind collecting mask 25, the wind direction H3 is guided so that no dead point is formed. By the wind collecting effect of the wind collecting mask, the wind is strong so that the resistance at the tops of the pin fins is reduced greatly. Meanwhile, wind resistance is reduced greatly as the wind is in contact with the concave surface of the seat and the turbulent is reduced greatly. Thereby, heat dissipating effect is improved greatly.

With reference to FIGS. 6 and 6-1, in this embodiment, the tops of the pin fins are formed as a concave surface and the upper surface of the heat dissipating seat 3 is a convex surface. This design cause that the wind blow out with a larger area. This is also within the scope of the present invention.

The advantages of the present invention is that strong wind is generated so that the heat dissipating is improved. The pressure at the tops of the heat dissipating device is reduced so that wind can blow into the heat dissipating seat effectively. The density of the fins or post can be increased greatly so as to increase the heat dissipating area greatly. The wind collecting mask has the effect of guiding airflow, thereby, no heat dissipating dead point being formed.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipating device comprising a turbine-type fan having a plurality of blades which are axially arranged along an axis of the fan; a cover covering the blades; a wind collecting mask installed below the cover; and a wind outlet formed in the wind collecting mask;

a heat dissipating seat installed below the turbine-type fan; wherein a bottom surface of the heat dissipating seat is parallel to the axis of the fan; and a plurality of heat dissipating units extending from a surface of the heat dissipating seat between the seat and the turbine-type fan; and wherein wind is sucked by the turbine-type fan, then flows toward the wind collecting mask, then flows out of the outlet of the wind collecting mask to enter into the heat dissipating units and then flows to the heat dissipating seat for dissipating heat from the heat dissipating units and the heat dissipating seat;

wherein the surface of the heat dissipating seat is a concave surface; and wherein the heat dissipating units are pin fins; an upper surface formed by upper ends of the heat dissipating units is formed as a concave surface and a bottom surface formed by lower ends of the heat dissipating units is formed as a convex surface corresponding to the concave surface of the heat dissipating seat; a bottom surface of the wind collecting mask is a convex surface corresponding to the concave surface formed by the upper ends of the heat dissipating units.

2. A heat dissipating device comprising a turbine-type fan having a plurality of blades which are axially arranged along an axis of the fan; a cover covering the blades; a wind collecting mask installed below the cover; and a wind outlet formed in the wind collecting mask;

a heat dissipating seat installed below the turbine-type fan; wherein a bottom surface of the heat dissipating seat is parallel to the axis of the fan; and a plurality of heat dissipating units extending from a surface of the heat dissipating seat between the seat and the turbine-type fan; and wherein wind is sucked by the turbine-type fan, then flows toward the wind collecting mask, then flows out of the outlet of the wind collecting mask to enter into the heat dissipating units and then flows to the heat dissipating seat for dissipating heat from the heat dissipating units and the heat dissipating seat;

wherein the surface of the heat dissipating seat is a convex surface; and wherein the heat dissipating units are pin fins; an upper surface formed by upper ends of the heat dissipating units is formed as a concave surface and a bottom surface of lower ends of the heat dissipating units is formed as a concave surface corresponding to the convex surface of the heat dissipating seat; a bottom surface of the wind collecting mask is a convex surface corresponding to the concave surface formed by the upper ends of the heat dissipating units.

\* \* \* \* \*